United States Patent
Kim et al.

(10) Patent No.: US 12,453,083 B2
(45) Date of Patent: Oct. 21, 2025

(54) SEMICONDUCTOR MEMORY DEVICE AND METHOD OF FORMING THE SAME

(71) Applicant: Samsung Electronics Co., Ltd., Suwon-si (KR)

(72) Inventors: Jonghyeok Kim, Suwon-si (KR); Jamin Koo, Suwon-si (KR); Beom Seo Kim, Suwon-si (KR); Wonseok Yoo, Suwon-si (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 486 days.

(21) Appl. No.: 18/149,800

(22) Filed: Jan. 4, 2023

(65) Prior Publication Data
US 2023/0422487 A1 Dec. 28, 2023

(30) Foreign Application Priority Data
Jun. 22, 2022 (KR) .......... 10-2022-0076243

(51) Int. Cl.
H10B 12/00 (2023.01)

(52) U.S. Cl.
CPC .......... H10B 12/482 (2023.02); H10B 12/02 (2023.02); H10B 12/315 (2023.02); H10B 12/34 (2023.02); H10B 12/485 (2023.02)

(58) Field of Classification Search
CPC .. H10B 12/482; H10B 12/485; H10B 12/315; H10B 12/34
See application file for complete search history.

(56) References Cited

U.S. PATENT DOCUMENTS

| | | | |
|---|---|---|---|
| 7,067,411 B2* | 6/2006 | Schuegraf | H01L 21/28247 257/E21.258 |
| 9,564,442 B2 | 2/2017 | Tang et al. | |
| 9,627,387 B2 | 4/2017 | Jung et al. | |
| 10,522,548 B2 | 12/2019 | Chun | |
| 10,770,465 B1 | 9/2020 | Kim et al. | |
| 2003/0082862 A1* | 5/2003 | Richter | H10D 64/021 438/303 |
| 2009/0160011 A1 | 6/2009 | Park | |
| 2015/0061134 A1* | 3/2015 | Lee | H10B 12/34 257/751 |
| 2020/0203354 A1* | 6/2020 | Lee | H10B 12/02 |
| 2021/0398569 A1* | 12/2021 | Hong | H10B 12/03 |

FOREIGN PATENT DOCUMENTS

KR 10-2000-0065823 A 11/2000
KR 10-0951695 B1 4/2010

* cited by examiner

Primary Examiner — Steven M Page
(74) Attorney, Agent, or Firm — Fish & Richardson P.C.

(57) ABSTRACT

A semiconductor memory device including an active pattern defined by a device isolation pattern, a bit line extending in a first direction on the device isolation pattern and the active pattern, a bit line capping pattern including a first capping pattern, a second capping pattern, and a third capping pattern sequentially stacked on an upper surface of the bit line, and a shield pattern covering one side of the bit line may be provided. An upper surface of the shield pattern may be at a height lower than an upper surface of the first capping pattern.

20 Claims, 20 Drawing Sheets

SEMICONDUCTOR MEMORY DEVICE AND METHOD OF FORMING THE SAME

CROSS-REFERENCE TO RELATED APPLICATIONS

This U.S. non-provisional patent application claims priority under 35 U.S.C. § 119 to Korean Patent Application No. 10-2022-0076243, filed on Jun. 22, 2022, in the Korean Intellectual Property Office, the entire contents of which are hereby incorporated by reference.

BACKGROUND

Some example embodiments of the inventive concepts relate to semiconductors, and more particularly, to semiconductor memory devices and/or a method of manufacturing the same.

A semiconductor device, due to characteristics such as miniaturization, multifunctionality, and/or low manufacturing cost, is in the spotlight as an importance element in an electronic industry. The semiconductor device may be classified into a semiconductor memory device for storing logic data, a semiconductor logic device for processing logic data, and a hybrid semiconductor device including a storage element and a logic element.

Recently, due to the high-speed and low-power consumption requirements of the electronic device, the semiconductor device embedded therein are also required to have high operating speed and/or low operating voltage. To satisfy these required characteristics, the semiconductor device becomes highly integrated. As high integration of the semiconductor device deepens, electrical characteristics and reliability of the semiconductor device may deteriorate. Accordingly, many studies are conducted to improve the electrical characteristics and reliability of the semiconductor device.

SUMMARY

Some example embodiments of the inventive concepts are to provide semiconductor memory devices having improved electrical characteristics and reliability.

The problem to be solved by the inventive concept is not limited to the problems mentioned above, and other problems not mentioned will be clearly understood by those skilled in the art from the following description.

A semiconductor memory device according to an example embodiment of the inventive concepts may include an active pattern defined by a device isolation pattern, a bit line extending in a first direction on the device isolation pattern and the active pattern, a bit line capping pattern including a first capping pattern, a second capping pattern, and a third capping pattern sequentially stacked on an upper surface of the bit line, and a shield pattern covering one side of the bit line. An upper surface of the shield pattern may be at a height lower than an upper surface of the first capping pattern.

A semiconductor memory device according to an example embodiment of the inventive concepts may include an active pattern defined by a device isolation pattern, a bit line extending in a first direction on the device isolation pattern and the active pattern, a bit line contact between the active pattern and the bit line, and a shield pattern covering one side of the bit line and extending on one side of the bit line contact. The shield pattern may include at least one of polysilicon, silicon oxide, or a combination thereof.

A semiconductor memory device according to an example embodiment of the inventive concepts may include active patterns defined by a device isolation pattern, bit lines extending in a first direction on the device isolation pattern and the active patterns, the bit lines spaced apart from each other in a second direction crossing the first direction, word lines extending in the second direction within the active patterns and spaced apart from each other in the first direction, bit line contacts interposed between the active patterns and the bit lines, the bit line contacts spaced apart from each other in the first and second directions, bit line capping patterns on upper surfaces of the bit lines, each of the bit line capping patterns including a first capping pattern, a second capping pattern, and a third capping pattern sequentially stacked, bit line spacers disposed on side surfaces of the bit lines, respectively, shield patterns interposed between the side surfaces of the bit lines and the bit line spacers, respectively, storage node contacts interposed between adjacent bit lines and spaced apart from each other in the first and second directions, landing pads on the storage node contacts, and data storage patterns connected to the active patterns through the storage node contacts and the landing pads. An upper surface of the first capping pattern may be at a height higher than an upper surface of a corresponding one of the shield patterns.

A method of manufacturing a semiconductor memory device according to an example embodiment of the inventive concepts may include forming a device isolation pattern on a substrate to define an active pattern including first recess regions, forming a bit line contact, a bit line, and a bit line capping pattern on the active pattern in each of the first recess regions, forming a shield pattern covering one side of the bit line contact and one side of the bit line, and forming a bit line spacer covering one side of the shield pattern and the bit line capping pattern. The bit line capping pattern may include a first capping pattern, a second capping pattern, and a third capping pattern sequentially stacked. An upper surface of the shield pattern may be positioned at a height lower than an upper surface of the first capping pattern.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 7A to 11B are views illustrating a method of manufacturing a semiconductor memory device according to an example embodiment of the inventive concepts, FIGS. 7A, 8A, 9A, 10A, and 11A are views corresponding to line A-A' of FIG. 2, and FIGS. 7B, 8B, 9B, 10B, and 11B are cross-sectional views corresponding to the B-B' of FIG. 2.

DETAILED DESCRIPTION

Hereinafter, some example embodiments according to the inventive concepts will be described with reference to the accompanying drawings.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
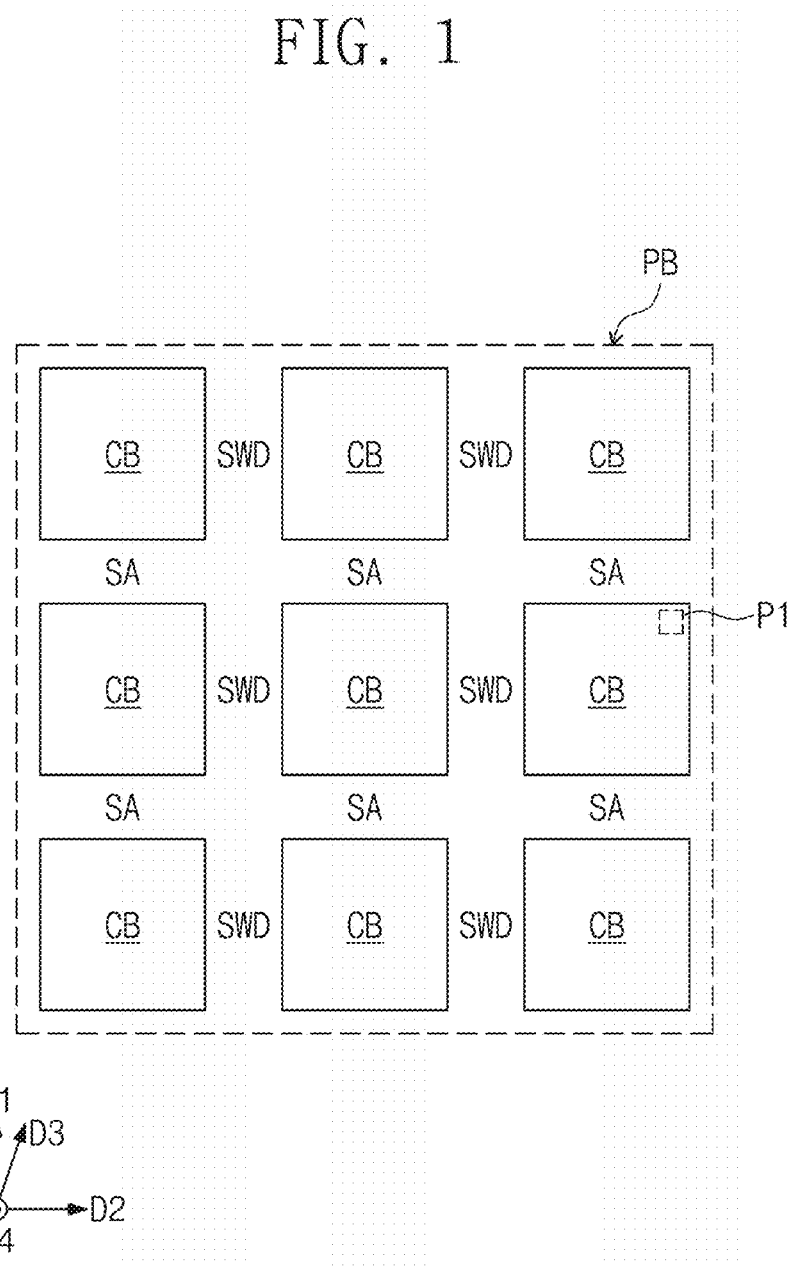
FIG. 1 is a block diagram of a semiconductor memory device according to an example embodiment of the inventive concepts.

FIG. 1 is a block diagram of a semiconductor memory device according to an example embodiment of the inventive concepts.

Referring to FIG. 1, a semiconductor memory device may include cell blocks CB and a peripheral block PB surrounding each of the cell blocks CB. Each of the cell blocks CB may include a cell circuit such as a memory integrated circuit. The peripheral block PB may include various peripheral circuits for an operation of the cell circuit, and the peripheral circuits may be electrically connected to the cell circuit.

The peripheral block PB may include sense amplifier circuits SA and sub-word line driver circuits SWD. For example, the sense amplifier circuits SA may face each other with the cell blocks CB interposed therebetween, and the sub-word line driver circuits SWD may face each other with the cell blocks CB interposed therebetween. The peripheral block PB may further include power and ground driver circuits for driving the sense amplifier, but the inventive concepts are not limited thereto.

Figure 2:
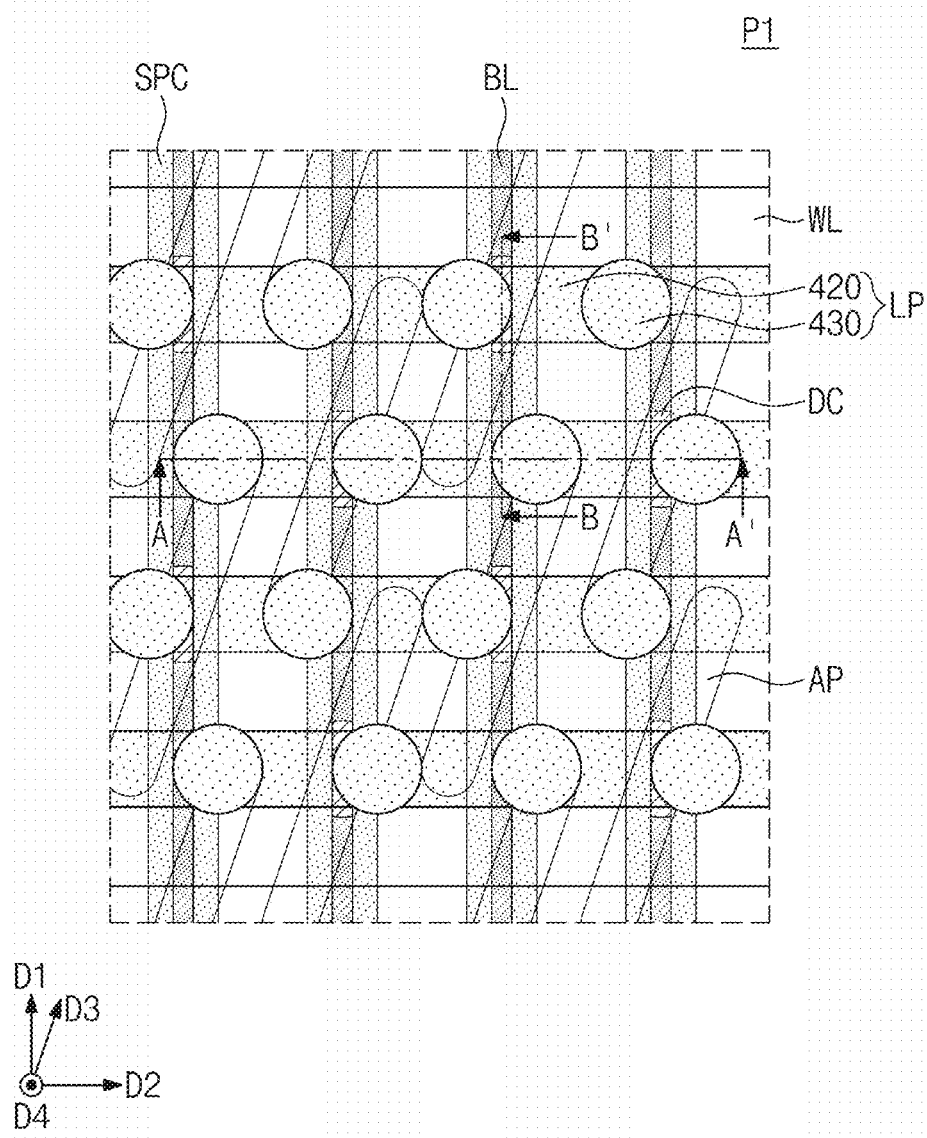
FIG. 2 is a diagram illustrating a semiconductor memory device according to an example embodiment of the inventive concepts, and is a plan view corresponding to a portion P1 of FIG. 1.
Figure 3A:
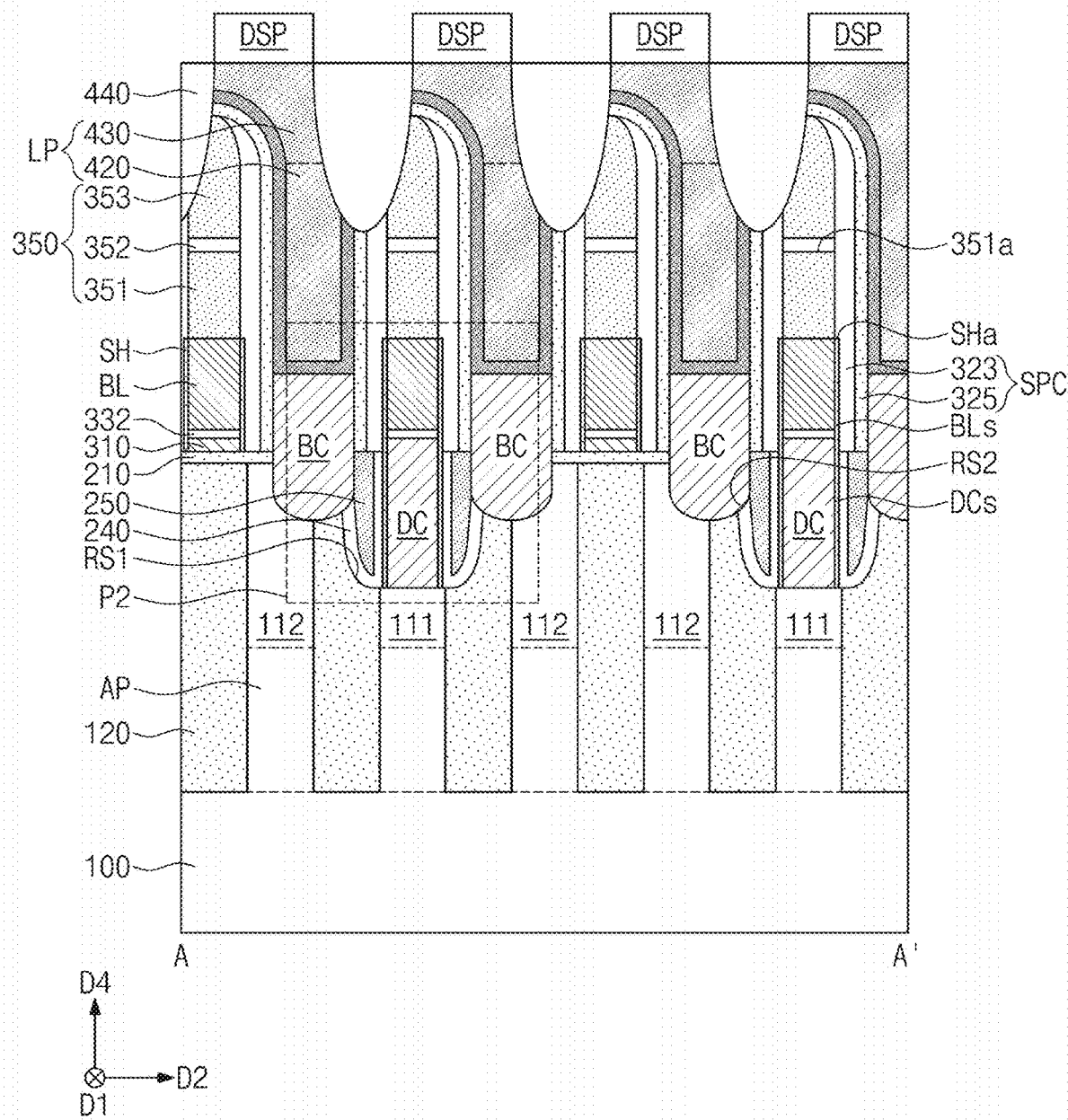
FIGS. 3A and 3B are cross-sectional views corresponding to lines A-A' and B-B' of FIG. 2, respectively.
Figure 3B:
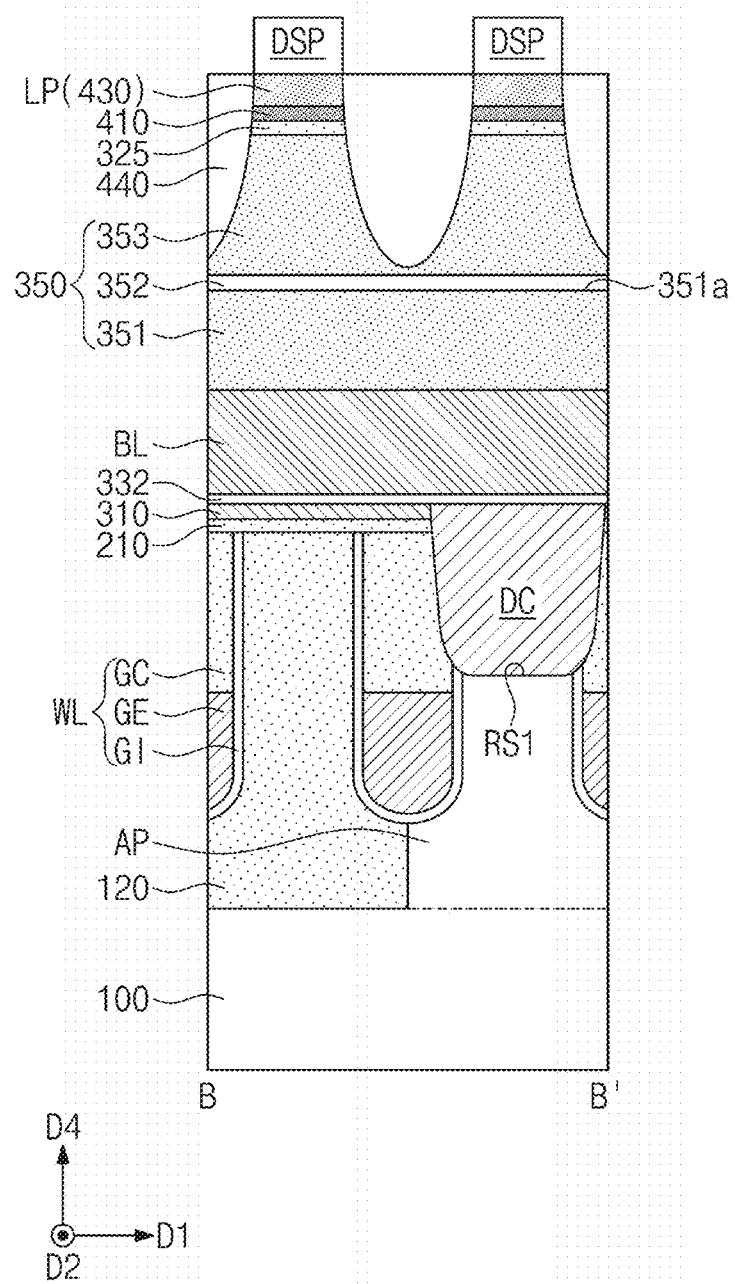
Figure 4:
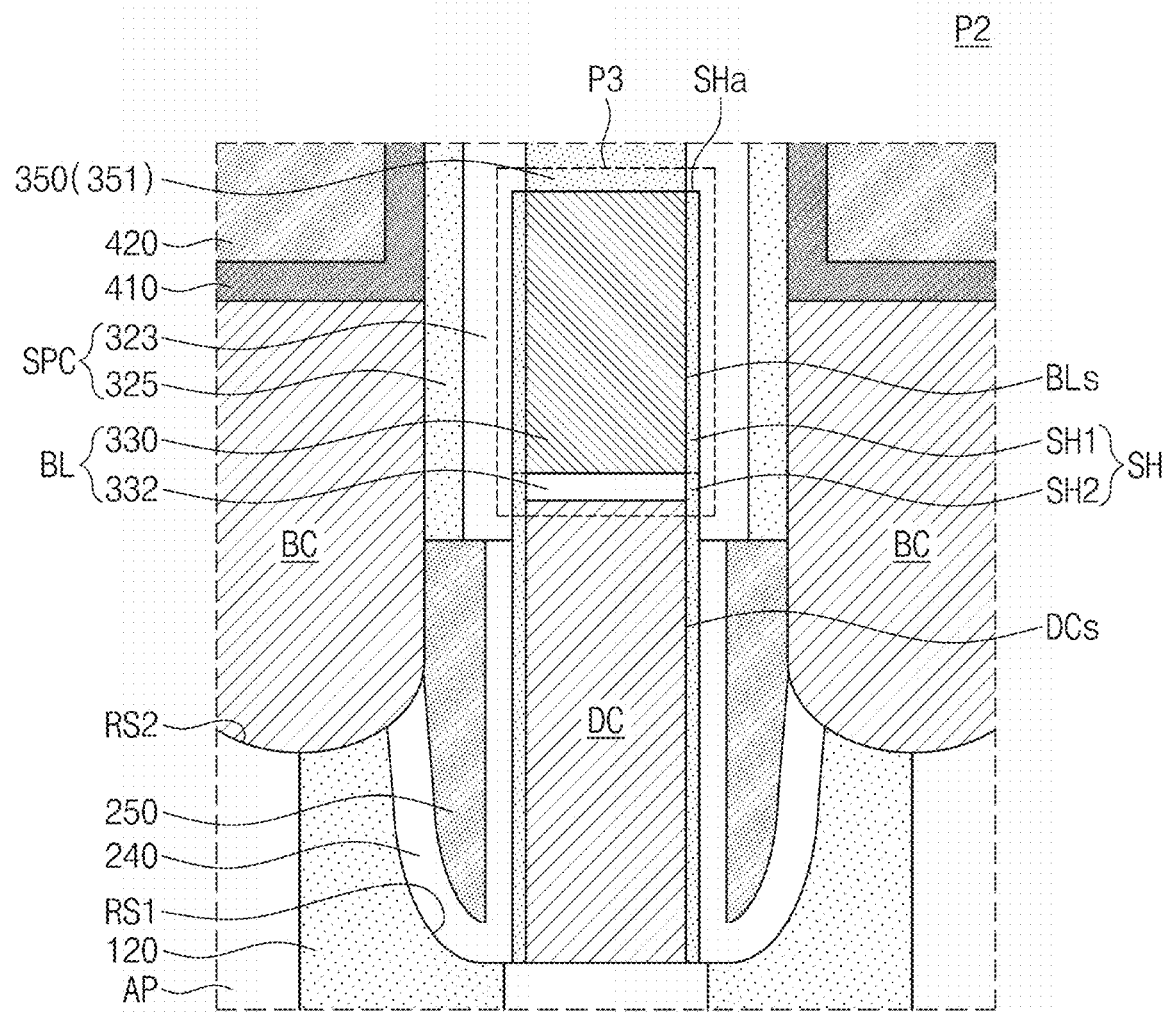
FIG. 4 is an enlarged view of a portion P2 of FIG. 2.

FIG. 2 is a diagram illustrating a semiconductor memory device according to an example embodiment of the inventive concepts, and is a plan view corresponding to a portion P1 of FIG. 1. FIGS. 3A and 3B are cross-sectional views corresponding to lines A-A' and B-B' of FIG. 2, respectively. FIG. 4 is an enlarged view of a portion P2 of FIG. 2. FIGS. 5A to 5D are enlarged views of a portion P3 of FIG. 4.

Referring to FIGS. 2, 3A and 3B, a substrate 100 may be provided. The substrate 100 may be a semiconductor substrate, for example, a silicon substrate, a germanium substrate, or a silicon-germanium substrate.

A device isolation pattern 120 may be disposed in the substrate 100 and may define active patterns AP. The active patterns AP may be disposed to be spaced apart from each other in a first direction D1 and a second direction D2 intersecting each other (e.g., the second direction D2 is perpendicular to the first direction D1). The first direction D1 and the second direction D2 may be parallel to a lower surface of the substrate 100.

Each of the active patterns AP may have an island shape separated from each other, and may have a bar shape elongated in a third direction D3. The third direction D3 may be parallel to the lower surface of the substrate 100, and may intersect the first and second directions D1 and D2 (e.g., may be inclined with respect to both the first and second directions D1 and D2. In a plan view, the active patterns AP may be portions of the substrate 100 surrounded by the device isolation pattern 120. The active patterns AP may protrude in a fourth direction D4 perpendicular to the lower surface of the substrate 100. The device isolation pattern 120 may include an insulating material, and may include, for example, at least one of silicon oxide, silicon nitride, or a combination thereof. As used herein, "A or B", "at least one of A and B", "at least one of A or B", "A, B or C", "at least one of A, B and C", and "A, B, or C," each of which may include any one of the configurations listed together in a corresponding one of the phrases, or all possible combinations thereof. In other words, expressions such as "A or B", "at least one of A and B", "at least one of A or B", "A, B or C", "at least one of A, B and C", and "A, B, or C," when preceding a list of elements, modify the entire list of elements and do not modify the individual elements of the list. Thus, for example, both "at least one of A, B, or C" and "at least one of A, B, and C" mean either A, B, C or any combination thereof.

First impurity regions 111 and second impurity regions 112 may be provided in the active patterns AP. The second impurity regions 112 may be provided in both edge regions of each of the active patterns AP. Each of the first impurity regions 111 may be interposed between the second impurity regions 112 in each of the active patterns AP. The first impurity regions 111 may include impurities of the same conductivity type (e.g., N-type) as those of the second impurity regions 112.

A word line WL may be provided in the active patterns AP. The word line WL may be provided in plurality. The word lines WL may extend in the second direction D2 and may be spaced apart from each other in the first direction D1. The word lines WL may be disposed in trenches provided in the active patterns AP and the device isolation pattern 120. For example, a pair of word lines WL adjacent to each other in the first direction D1 may cross a corresponding one of the active patterns AP.

Each of the word lines WL may include a gate electrode GE, a gate dielectric pattern GI, and a gate capping pattern GC. The gate electrode GE may pass through the active patterns AP and the device isolation pattern 120 in the second direction D2. The gate dielectric pattern GI may be interposed between the gate electrode GE and the active patterns AP and between the gate electrode GE and the device isolation pattern 120. The gate capping pattern GC may cover the gate electrode GE on the gate electrode GE.

A buffer pattern 210 may be disposed on the substrate 100. The buffer pattern 210 may cover the active patterns AP, the device isolation pattern 120, and the word lines WL. For example, the buffer pattern 210 may include at least one of silicon oxide, silicon nitride, silicon oxynitride, or a combination thereof.

A bit line BL may be provided on the device isolation pattern 120 and the active patterns AP. The bit line BL may be provided in plurality. The bit lines BL may extend in the first direction D1 and may be spaced apart from each other in the second direction D2. The bit line BL may include a metal material. For example, the bit line BL may include at least one of tungsten, rubidium, molybdenum, titanium, or a combination thereof.

A bit line contact DC may be provided on each of the active patterns AP, or may be provided in a plurality. The bit line contacts DC may be connected to the first impurity regions 111 in the active patterns AP, respectively. The bit line contacts DC may be spaced apart from each other in the first and second directions D1 and D2. The bit line contacts DC may be interposed between the active patterns AP and the bit lines BL, respectively. One bit line contact DC may electrically connect a corresponding bit line BL among the bit lines BL and a corresponding first impurity region 111.

The bit line contacts DC may be disposed in first recess regions RS1, respectively. The first recess regions RS1 may be provided on upper portions of the active patterns AP and the device isolation pattern 120 adjacent to the upper portions of the active patterns AP. The first recess regions RS1 may be spaced apart from each other in the first and second directions D1 and D2.

A polysilicon pattern 310 may be provided between the bit line BL and the buffer pattern 210, and between the bit line contacts DC adjacent to each other in the first direction D1. The polysilicon pattern 310 may be provided in plurality. A upper surface of the polysilicon pattern 310 may be positioned at the same or substantially equal height as a upper surface of the bit line contact DC, and may be coplanar. The polysilicon pattern 310 may include polysilicon.

A first barrier pattern 332 may be provided between the bit line BL and the bit line contact DC, and between the bit line BL and the polysilicon pattern 310. The first barrier patterns 332 may extend along the bit lines BL in the first direction D1 and may be spaced apart from each other in the second direction D2. The first barrier patterns 332 may include a conductive metal nitride, and may include, for example, at least one of tungsten oxide, rubidium oxide, molybdenum oxide, or titanium oxide, or a combination thereof. A first ohmic pattern (not shown) may be further interposed between the first barrier pattern 332 and the bit line contact DC. The first ohmic pattern may include metal silicide.

A bit line capping pattern 350 may be provided on an upper surface of the bit line BL. The bit line capping pattern 350 may be provided in plurality. Each of the bit line capping patterns 350 may extend in the first direction D1 along a corresponding bit line BL, and may be spaced apart from each other in the second direction D2. The bit line capping pattern 350 may vertically overlap the bit line BL. The bit line capping pattern 350 may include a first capping pattern 351, a second capping pattern 352, and a third capping pattern 353 sequentially stacked on the upper surface of the corresponding bit line BL. The bit line capping pattern 350 may include silicon nitride.

A bit line spacer SPC may be provided on side surface BLs of the bit line BL and side surface of the bit line capping pattern 350. The bit line spacer SPC may cover the side surface BLs of the bit line BL and the side surface of the bit line capping pattern 350. The bit line spacers SPC may be provided in plurality.

For example, the bit line spacer SPC may include a first spacer 323 and a second spacer 325. The second spacer 325 may be provided on the side surface BLs of the bit line BL, and the first spacer 323 may be interposed between the side surface BLs of the bit line BL and the second spacer 325. In some example embodiments, the second spacer 325 may cover an upper surface of the bit line capping pattern 350.

The bit line spacer SPC may be in contact with the side surface of the bit line capping pattern 350. For example, the first spacer 323 may be in contact with the side surface of the bit line capping pattern 350. The bit line spacer SPC may be spaced apart from the side surface BLs of the bit line BL. For example, the first spacer 323 may be spaced apart from the side surface BLs of the bit line BL by a shield pattern SH to be described later. For example, the first spacer 323 may include silicon oxide, and the second spacer 325 may include silicon nitride. As another example, the first spacer 323 may include an empty space including an air layer (e.g., an air gap).

A first buried pattern 240 and a second buried pattern 250 may fill each of the first recess regions RS1. The first buried pattern 240 may conformally cover an inner surface of the first recess region RS1 and at least a portion (e.g., at least a portion of side surfaces DCs of the bit line contact DC in the first recess region RS1) of side surfaces DCs of the bit line contact DC. For example, the first buried pattern 240 may be spaced apart from the side surfaces DCs of the bit line contact DC by the shield pattern SH to be described later. The second buried pattern 250 may fill the remainder of the first recess region RS1. For example, the first buried pattern 240 may include silicon oxide, and the second buried pattern 250 may include silicon nitride.

The shield pattern SH may be provided on the side surface BLs of the bit line BL and may extend on the side surface DCs of the bit line contact DC. The shield pattern SH may be provided in plurality. A pair of shield patterns SH may cover both side surfaces BLs of each of the bit lines BL and both side surfaces DCs of each of the bit line contacts DC. The shield pattern SH may be in contact with the side surface BLs of the bit line BL and the side surface DCs of the bit line contact DC. For example, the shield pattern SH may not be in contact with the side surface of the bit line capping pattern 350. The shield pattern SH may further cover a side surface of the polysilicon pattern 310.

An upper surface SHa of the shield pattern SH may be positioned at a height lower than the upper surface of the bit line capping pattern 350. For example, the upper surface SHa of the shield pattern SH may be positioned at a height lower than an upper surface 351a of the first capping pattern 351. For example, the upper surface SHa of the shield pattern SH may be positioned at the same or substantially equal height as the upper surface of the bit line BL. A lower surface of the shield pattern SH may be positioned at the same or substantially equal height as a lower surface of the bit line contact DC.

The shield pattern SH may be interposed between the side surface BLs of the bit line BL and the bit line spacer SPC, and between the side surface DCs of the bit line contact DC and the first buried pattern 240. The shield pattern SH may separate the side surface BLs of the bit line BL and the bit line spacer SPC (e.g., the first spacer 323) from each other. The shield pattern SH may separate the side surface DCs of the bit line contact DC and the first buried pattern 240 from each other. For example, the shield pattern SH may not be interposed between the side surface of the bit line capping pattern 350 and the bit line spacer SPC. The shield pattern SH may include at least one of polysilicon, silicon oxide, or a combination thereof. For example, the shield pattern SH may further include at least one of carbon, nitrogen, chlorine, or a combination thereof.

The shield pattern SH may separate the side surface BLs of the bit line BL from the bit line spacer SPC, and thus oxidation of the metal in the bit line BL due to the first spacer 323 of the bit line spacer SPC may be mitigated or prevented. Also, even after the metal in the bit line BL is oxidized, the shield pattern SH may reduce the metal oxide back to the metal. Thus, electrical characteristics and reliability of the semiconductor memory device may be improved.

Hereinafter, some features and some example embodiments of the shield pattern SH and the bit line BL will be described in detail with reference to FIGS. 4 and 5A to 5D.

Referring to FIGS. 4 and 5A to 5D, the shield pattern SH may include a first shield pattern SH1 and a second shield pattern SH2. The first shield pattern SH1 may be a region of the shield pattern SH provided on the side surface BLs of the bit line BL. The second shield pattern SH2 may be another region of the shield pattern SH provided on the side surface DCs of the bit line contact DC. The second shield pattern SH2 may include polysilicon.

In some example embodiments, the first shield pattern SH1 may include a first portion SH1x and a second portion SH1y. The first portion SH1x may be a region of the first shield pattern SH1 provided on the side surface BLs of the bit line BL. The second portion SH1y may be another region of the first shield pattern SH1 provided between the side surface BLs of the bit line BL and the first portion SH1x. For example, the first portion SH1x may include polysilicon. For example, the second portion SH1y may include silicon oxide.

Figure 5A:
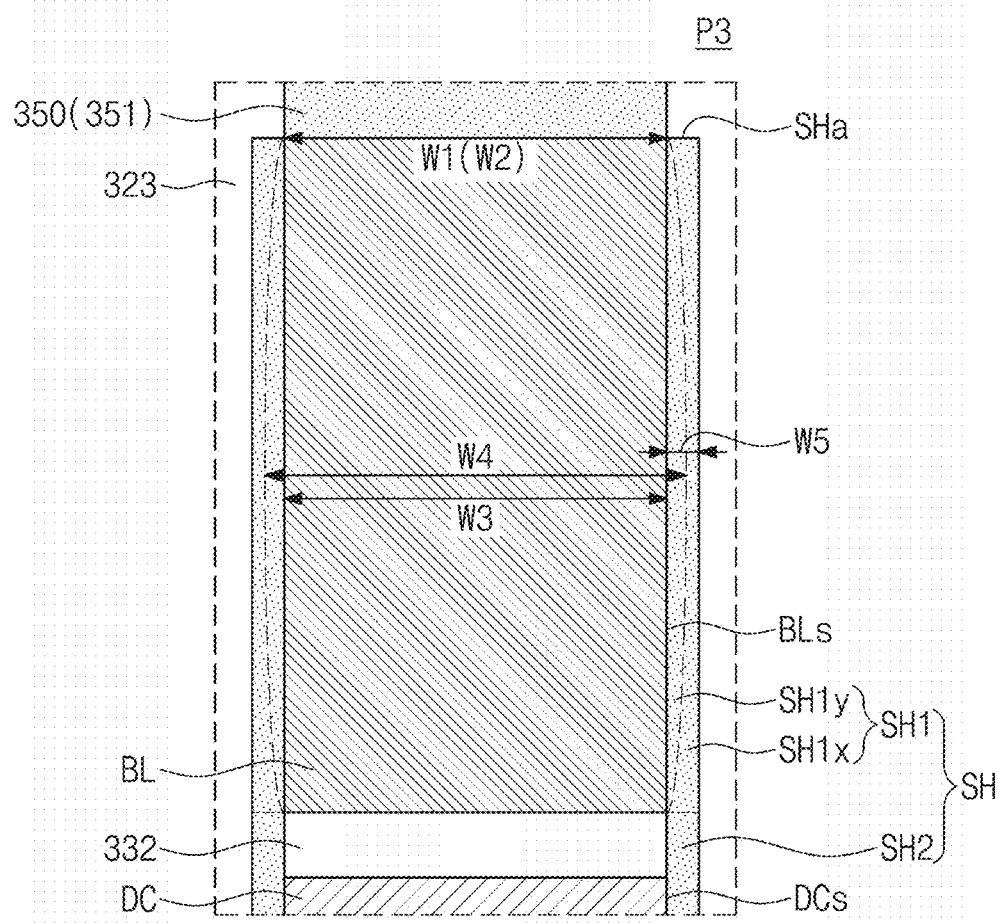
FIGS. 5A to 5D are enlarged views of a portion P3 of FIG. 4.
Figure 5B:
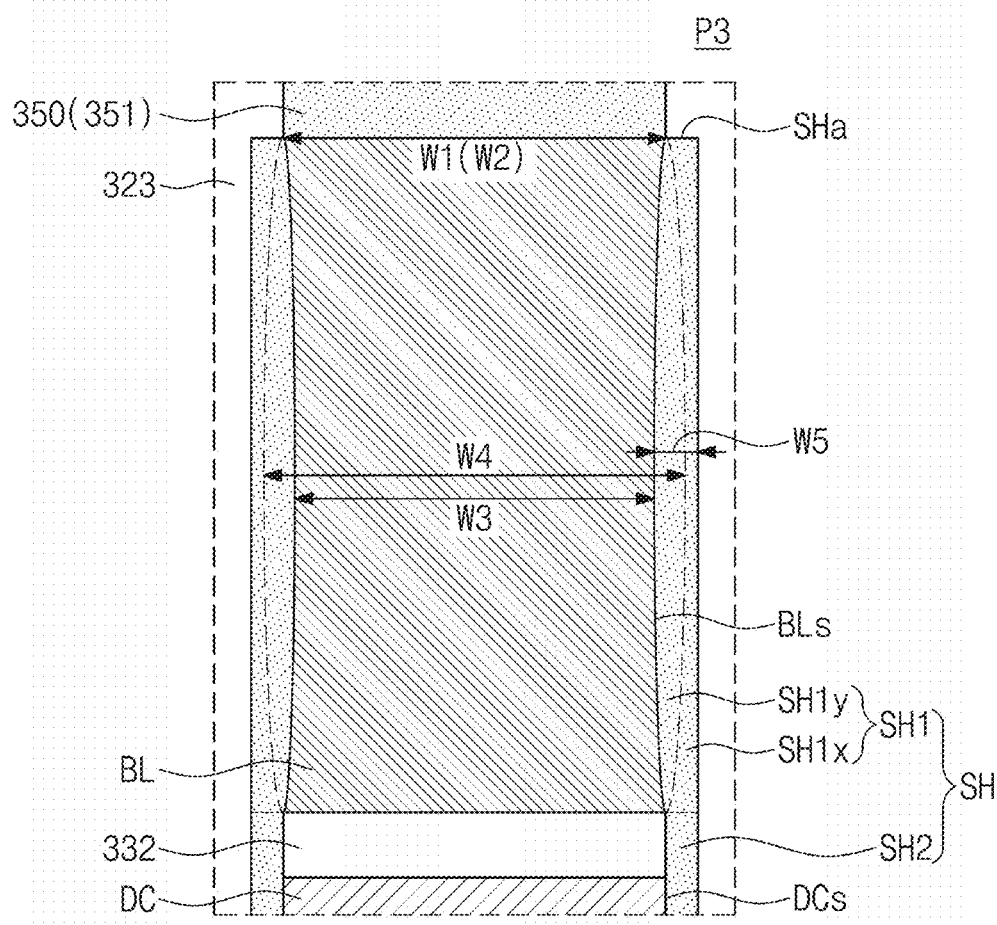
Figure 5C:
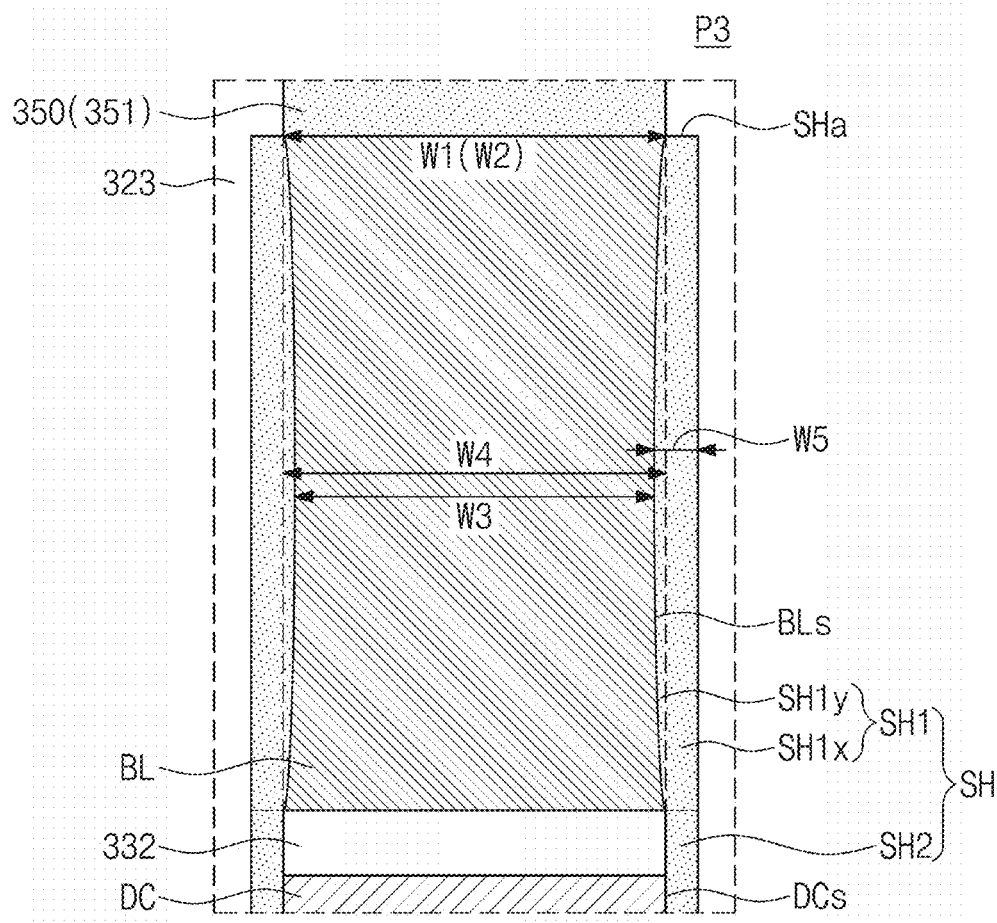
Figure 5D:
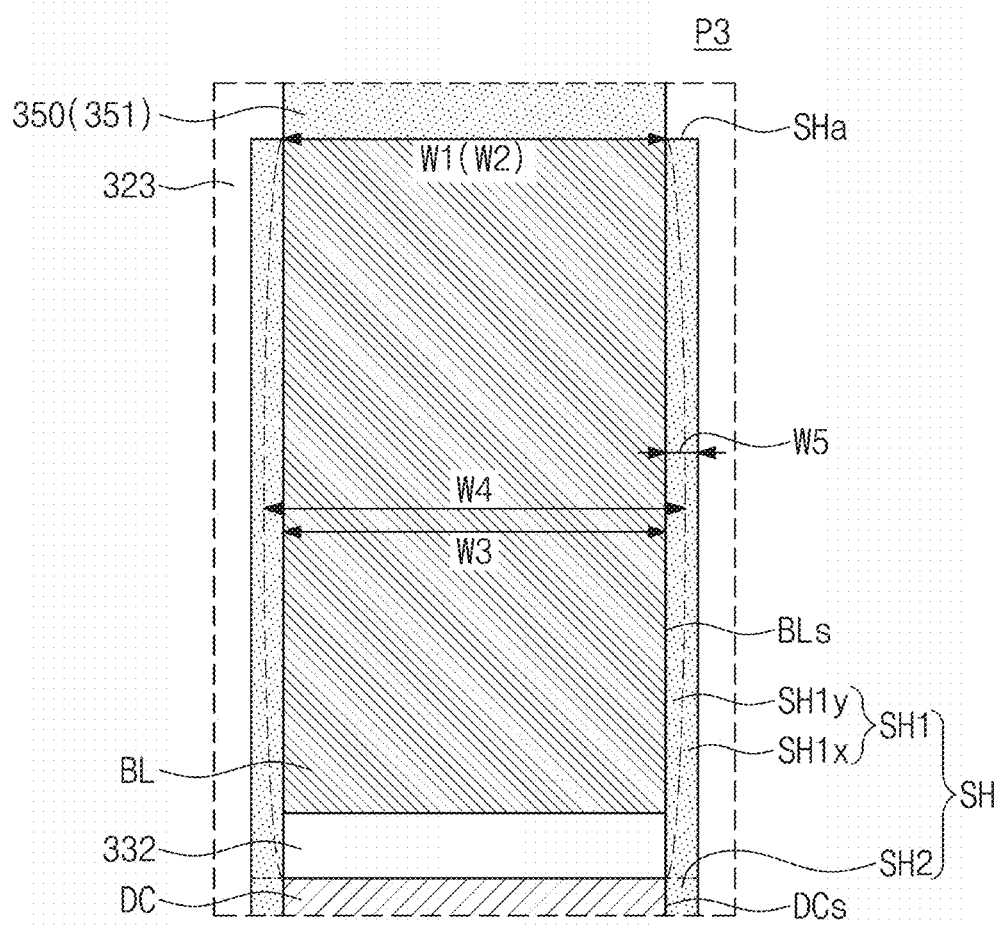

The first shield pattern SH1 may be disposed above a lower end of the second portion SH1y, and the second shield pattern SH2 may be disposed lower than a lower end of the second portion SH1y. For example, as shown in FIGS. 5A to 5C, the lower end of the second portion SH1y may be provided at the same or substantially equal height as the lower surface of the bit line BL. As another example, as shown in FIG. 5D, the lower end of the second portion SH1y may be provided below the lower surface of the bit line BL (e.g., at the same or substantially equal height as a lower surface of the first barrier pattern 332). A height of the lower end of the second portion SH1y may be higher than or the same or substantially equal as a height of an upper surface of the bit line contact DC.

According to various example embodiments, relationship between a first width W1, a second width W2, a third width W3, and a fourth width W4 may be variously different from each other. The first width W1 may be a width of the upper surface of the bit line BL in the second direction D2. The second width W2 may be a distance between the second portions SH1y of the pair of shield patterns SH in the second direction D2, at the same height as the first width W1. The third width W3 may be a width of the bit line BL in the second direction D2, at a midpoint of the bit line BL. The midpoint may be a point at which a distance from the upper surface of the bit line BL is the same as a distance from the lower surface of the bit line BL. The fourth width W4 may be a distance between the first portions SH1x of the pair of shield patterns SH in the second direction D2, at the same height as the third width W3. For convenience, although heights of the third width W3 and the fourth width W4 are indicated differently in the drawings, the height at which the third width W3 and the fourth width W4 are defined is the same. The first width W1 and the second width W2 may be equal to each other.

For example, as shown in FIG. 5A, the third width W3 may be the same as or substantially equal to the first width W1, and for example, the side surface BLs of the bit line BL may have a straight-shaped profile. The fourth width W4 may be greater than the second width W2.

As another example, as shown in FIG. 5B, the third width W3 may be smaller than the first width W1, and for example, the side surfaces BLs of the bit line BL may have a concave profile. The fourth width W4 may be greater than the second width W2.

As another example, as shown in FIG. 5C, the third width W3 may be smaller than the first width W1, and for example, the side surfaces BLs of the bit line BL may have concave profile. The fourth width W4 may be the same as or substantially equal to the second width W2.

A fifth width W5 may be a thickness of the shield pattern SH in the second direction D2. For example, the fifth width W5 may be greater than 0 nm and less than or equal to 2 nm.

For example, the fifth width W5 may be constant or substantially constant regardless of the height. For example, as shown in FIG. 5A, the side surface of the shield pattern SH may also have a linear profile corresponding to a linear profile of the side surface BLs of the bit line BL. As another example, although not shown, when the side surface BLs of the bit line BL has a concave profile, the side surface of the shield pattern SH may also have a concave profile.

For example, the fifth width W5 may vary depending on the height. For example, as shown in FIGS. 5B and 5C, even when the side surface BLs of the bit line BL has a concave profile, the side surface of the shield pattern SH may not have a concave profile.

Referring to FIGS. 2, 3A, and 3B, a storage node contact BC may be provided between adjacent bit lines BL. The storage node contacts BC may be provided in plurality, and the storage node contacts BC may be spaced apart from each other in the first and second directions D1 and D2. Although not shown, the storage node contacts BC may be spaced apart from each other in the first direction D1 by fence patterns (not shown) on the word lines WL. The fence patterns may include, for example, silicon nitride.

The storage node contact BC may fill a second recess region RS2 provided on the second impurity region 112 in the active pattern AP. The storage node contact BC may be electrically connected to the second impurity region 112. The storage node contact BC may include at least one of doped or undoped polysilicon, a metal material, or a combination thereof.

A second barrier pattern 410 may conformally cover bit line spacer SPC and the storage node contact BC. The second barrier pattern 410 may include a metal nitride such as titanium nitride or tantalum nitride. A second ohmic pattern (not shown) may be further interposed between the second barrier pattern 410 and the storage node contact BC. The second ohmic pattern may include metal silicide.

A landing pad LP may be provided on the storage node contact BC. The landing pad LP may be provided in plurality, and the landing pads LP may be spaced apart from each other in the first and second directions D1 and D2. The landing pad LP may be electrically connected to a corresponding storage node contact BC. The landing pad LP may cover an upper surface of the bit line capping pattern 350.

The landing pad LP may include a lower landing pad 420 and an upper landing pad 430. The lower landing pad 420 may be a lower region of the landing pad LP and may vertically overlap the storage node contact BC. The upper landing pad 430 may be an upper region of the landing pad LP and may be shifted from the lower landing pad 420 in the second direction D2. The landing pad LP may include a metal material (e.g., tungsten, titanium, or tantalum).

A filling pattern 440 may surround the landing pad LP. The filling pattern 440 may be interposed between adjacent landing pads LP. In a plan view, the filling pattern 440 may have a mesh shape including holes penetrated by the landing pads LP. For example, the filling pattern 440 may include at least one of silicon nitride, silicon oxide, silicon oxynitride, or a combination thereof. As another example, the filling pattern 440 may include an empty space including an air layer (e.g., an air gap).

A data storage pattern DSP may be provided on the landing pad LP. The data storage patterns DSP may be provided in plurality, and the data storage patterns DSP may be spaced apart from each other in the first and second directions D1 and D2. The data storage pattern DSP may be connected to a corresponding second impurity region 112 through a corresponding landing pad LP and a corresponding storage node contact BC.

The data storage pattern DSP may be, for example, a capacitor including a lower electrode, a dielectric layer, and an upper electrode. In this case, a semiconductor memory device according to an example embodiment of the inventive concepts may be a dynamic random access memory (DRAM). The data storage pattern DSP may include, as another example, a magnetic tunnel junction pattern. In this case, a semiconductor memory device according to an example embodiment of the inventive concepts may be a magnetic random access memory (MRAM). As another example, the data storage pattern DSP may include a phase change material or a variable resistance material. In this case, a semiconductor memory device according to an example embodiment of the inventive concepts may be a phase-change random access memory (PRAM) or a resistive random access memory (ReRAM). However, these are merely exemplary, and the inventive concepts are not limited thereto, and the data storage pattern DSP may include various structures and/or materials capable of storing data.

Figure 6:
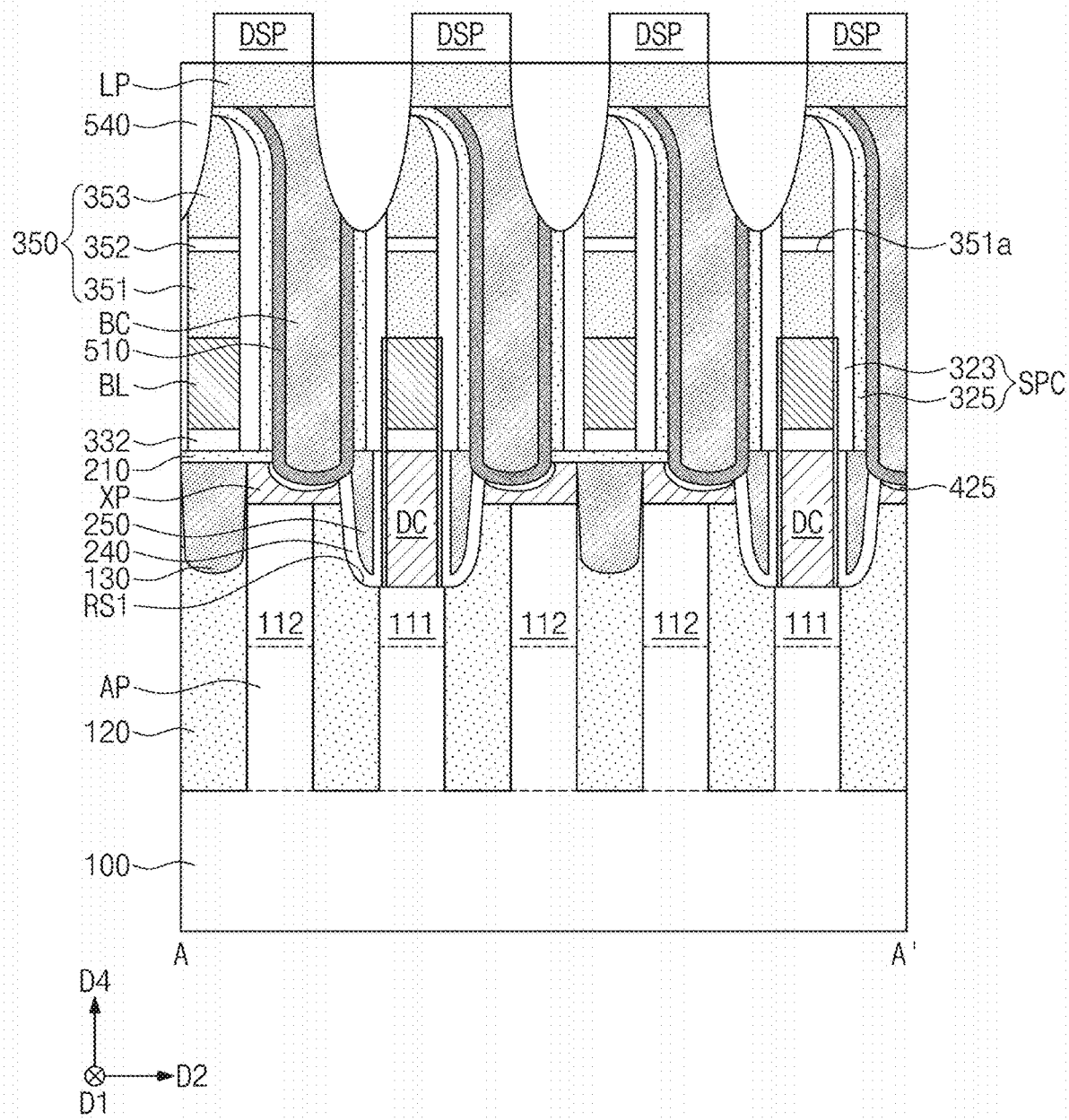
FIG. 6 is a cross-sectional view corresponding to line A-A' of FIG. 2.

FIG. 6 is a cross-sectional view corresponding to the line A-A' of FIG. 2. For simplification of the description, a description of the content overlapping with the above-described content will be omitted.

Referring to FIG. 6, a connection pattern XP may be provided on the second impurity region 112 in the active pattern AP. The connection pattern XP may be electrically connected to the second impurity region 112. The connection pattern XP may be provided in plurality. The connection patterns XP may be spaced apart from each other by the isolation insulating pattern 130. For example, an upper surface of the connection pattern XP and the upper surface of the isolation insulating pattern 130 may be positioned at the same or substantially equal height and may be coplanar with each other.

A storage node contact BC may be provided between adjacent bit lines BL. The storage node contacts BC may be provided in plurality, and the storage node contacts BC may be spaced apart from each other in the first and second directions D1 and D2. Although not shown, the storage node contacts BC may be spaced apart from each other in the first direction D1 by fence patterns (not shown) on the word lines WL.

The storage node contact BC may be connected to a corresponding connection pattern XP. The storage node contact BC may be electrically connected to a corresponding second impurity region 112 through the corresponding connection pattern XP. An upper portion of the storage node contact BC may be shifted in the second direction D2 from a lower portion of the storage node contact BC. The storage node contact BC may include at least one of doped or undoped polysilicon or a metal material, or a combination thereof.

A third barrier pattern 510 may be provided between the storage node contact BC and the bit line spacer SPC and between the storage node contact BC and the connection pattern XP. The third barrier pattern 510 may include a conductive metal nitride (e.g., titanium nitride, tungsten nitride, or tantalum nitride). A third ohmic pattern 425 may be provided between the third barrier pattern 510 and the connection pattern XP. The third ohmic pattern 425 may include metal silicide.

A landing pad LP may be provided on the storage node contact BC. The landing pads LP may be provided in plurality, and the landing pads LP may be spaced apart from each other in the first and second directions D1 and D2. The landing pad LP may be connected to a corresponding storage node contact BC. The landing pad LP may cover an upper surface of the bit line capping pattern 350. The landing pad LP may be shifted from the connection pattern XP in the second direction D2. The landing pad LP may include a metal material (e.g., tungsten, titanium, or tantalum).

A filling pattern 540 may surround each of the landing pads LP. The filling pattern 540 may be interposed between adjacent landing pads LP. In a plan view, the filling pattern 540 may have a mesh shape including holes penetrated by the landing pads LP. For example, the filling pattern 540 may include at least one of silicon nitride, silicon oxide, and silicon oxynitride. As another example, the filling pattern 540 may be an empty space including an air layer (e.g., an air gap).

FIGS. 7A to 11B are views illustrating a method of manufacturing a semiconductor memory device according to an example embodiment of the inventive concepts. FIGS. 7A, 8A, 9A, 10A, and 11A are views corresponding to the line A-A' of FIG. 2, and FIGS. 7B, 8B, 9B, 10B, and 11B are cross-sectional views corresponding to the line B-B' of FIG. 2. Hereinafter, a method of manufacturing a semiconductor memory device according to an example embodiment of the inventive concepts will be described with reference to FIG. 2 and FIGS. 7A to 11B. For simplification of the description, a description of the content overlapping with the above-described content will be omitted.

Figure 7A:
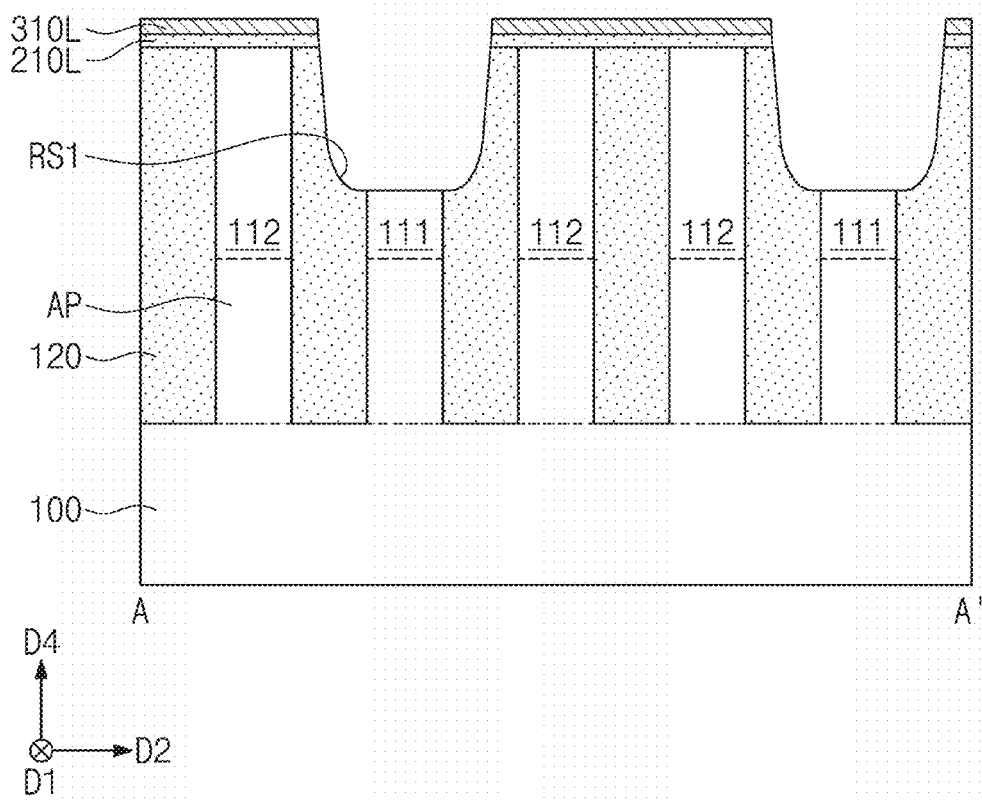
Figure 7B:
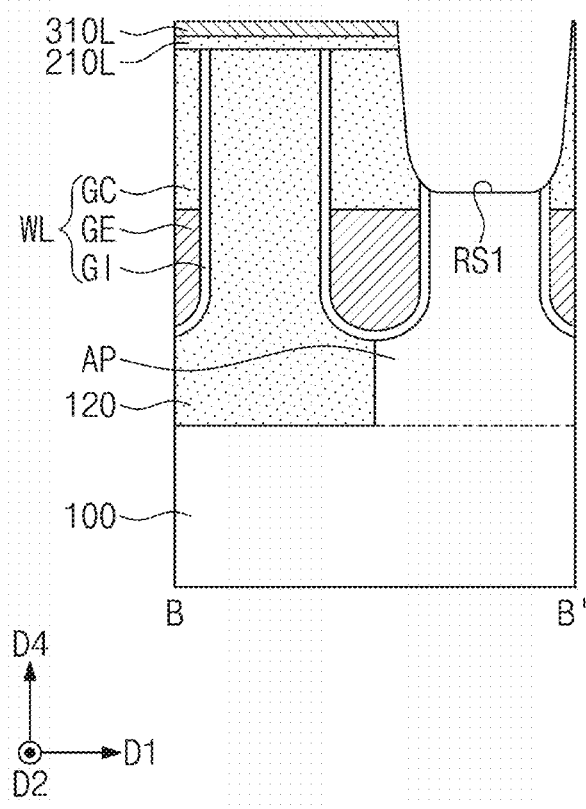

Referring to FIGS. 2, 7A, and 7B, a device isolation pattern 120 and an active pattern AP may be formed on a substrate 100. Forming the device isolation pattern 120 and the active pattern AP may include forming a groove in the substrate 100 through patterning, and filling the groove with an insulating material to form the device isolation pattern 120. The active pattern AP may include a region of the substrate 100 in which a groove is not formed. First and second impurity regions 111 and 112 may be formed in the active pattern AP.

Word lines WL may be formed in trenches formed on the substrate 100. Forming the word lines WL includes forming mask patterns on the active patterns AP and the device isolation pattern 120, forming the trenches by performing an anisotropic etching process using the mask patterns, and filling the trenches with the word lines WL. The word lines WL may be spaced apart from each other in the first direction D1 and may extend in the second direction D2 within the active patterns AP. The filling of the word lines WL may include, for example, conformally depositing a gate dielectric pattern GI on an inner surfaces of each of the trenches, filling the inside of the trenches with a conductive layer, forming a gate electrode GE through an etch-back and/or polishing process for the conductive layer, and forming a gate capping layer GC filling the remainder of the trenches on the gate electrode GE.

A buffer layer 210L and a polysilicon layer 310L may be sequentially formed on the substrate 100. The buffer layer 210L and the polysilicon layer 310L may cover an upper surface of the active pattern AP, an upper surface of the device isolation pattern 120, and an upper surface of the word line WL.

Thereafter, a first recess region RS1 may be formed on the active pattern AP. The first recess region RS1 may be provided in plurality. The first recess regions RS1 may be spaced apart from each other in the first and second directions D1 and D2. The first recess region RS1 may be formed on the first impurity region 111 in the active pattern AP. The first recess region RS1 may pass through the buffer layer 210L and the polysilicon layer 310L and may expose a portion of the first impurity region 111, a portion of the device isolation pattern 120, and a portion of the gate capping pattern GC to the outside.

Figure 8A:
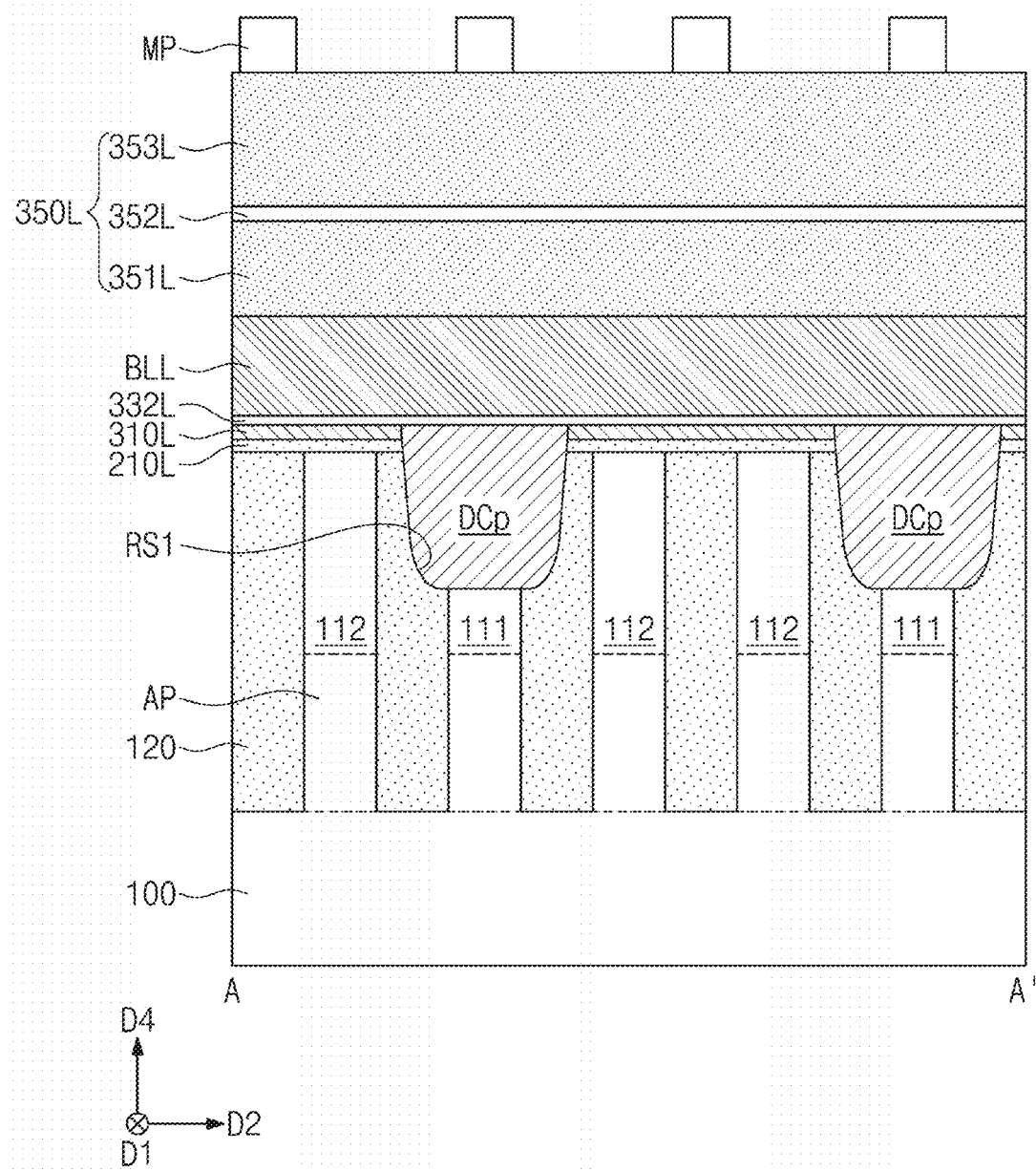
Figure 8B:
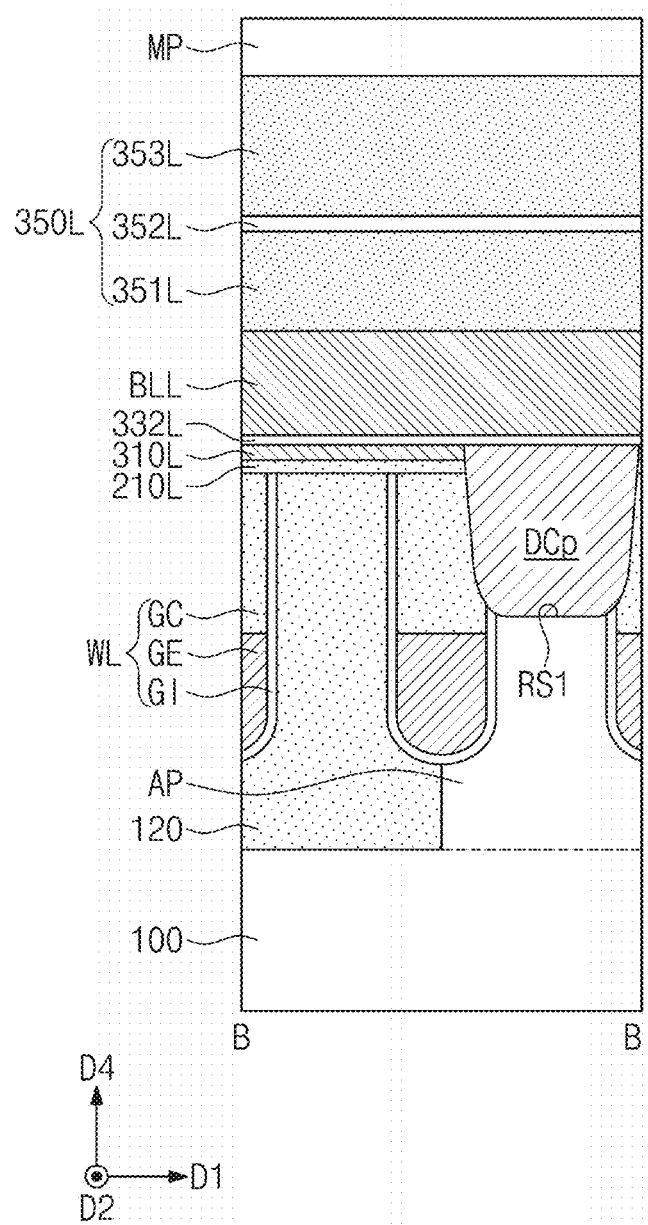

Referring to FIGS. 2, 8A, and 8B, a preliminary bit line contact DCp may be formed in the first recess region RS1 and may fill the first recess region RS1. The preliminary bit line contact DCp may be provided in plurality, and the preliminary bit line contacts DCp may be formed on the first impurity regions 111 in the active patterns AP, respectively. An upper surface of the preliminary bit line contact DCp may be formed at the same or substantially equal height as an upper surface of the polysilicon layer 310L, and may be coplanar.

A first barrier layer 332L, a bit line layer BLL, a bit line capping layer 350L, and mask patterns MP may be sequentially formed on the preliminary bit line contact DCp and the polysilicon layer 310L. The bit line capping layer 350L may include a first capping layer 351L, a second capping layer 352L, and a third capping layer 353L that are sequentially stacked. The mask patterns MP may extend in the first direction D1 and may be spaced apart from each other in the second direction D2. In a plan view, the mask patterns MP may cross the first impurity patterns 111 in the first direction D1.

Figure 9A:
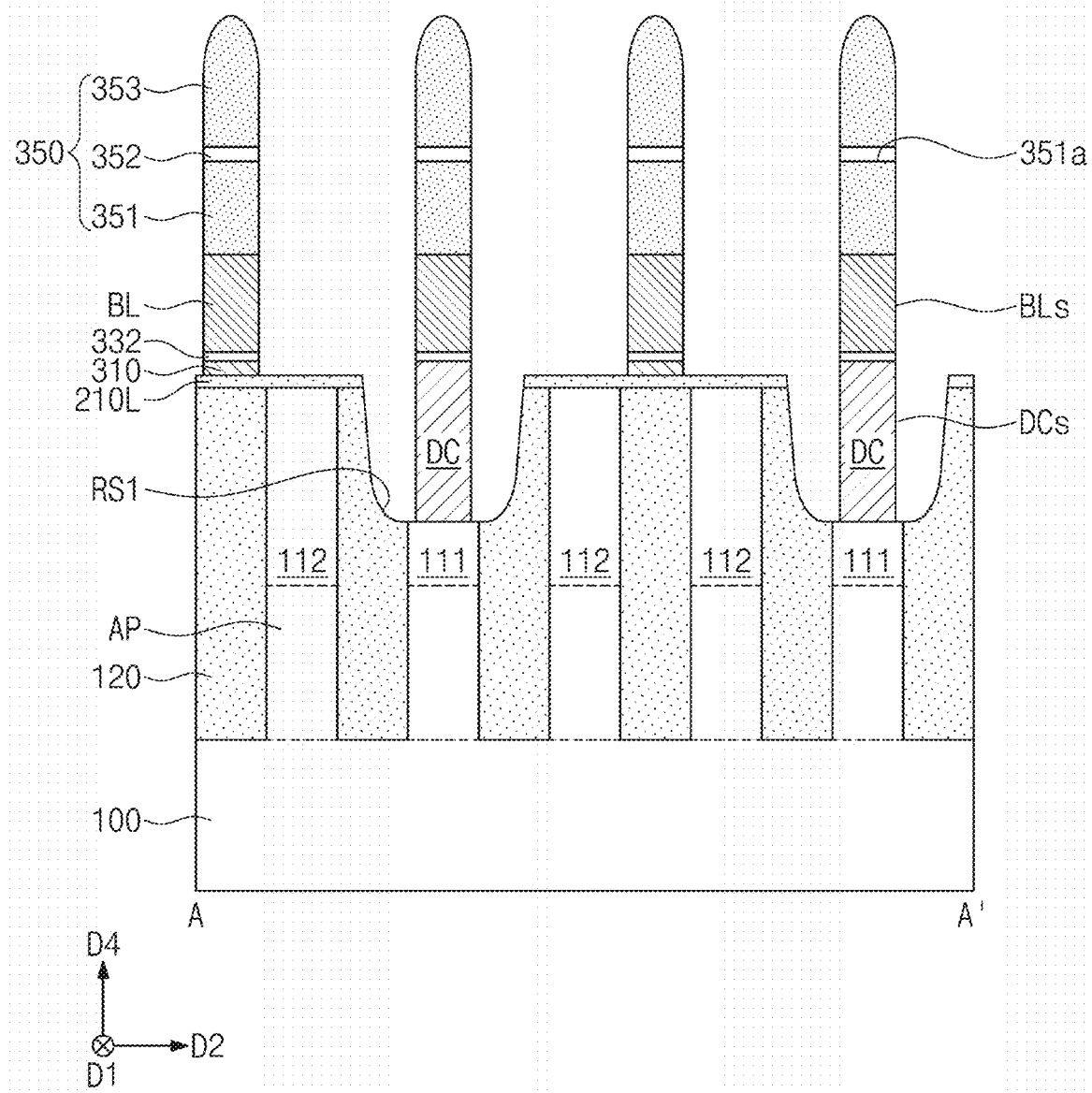
Figure 9B:
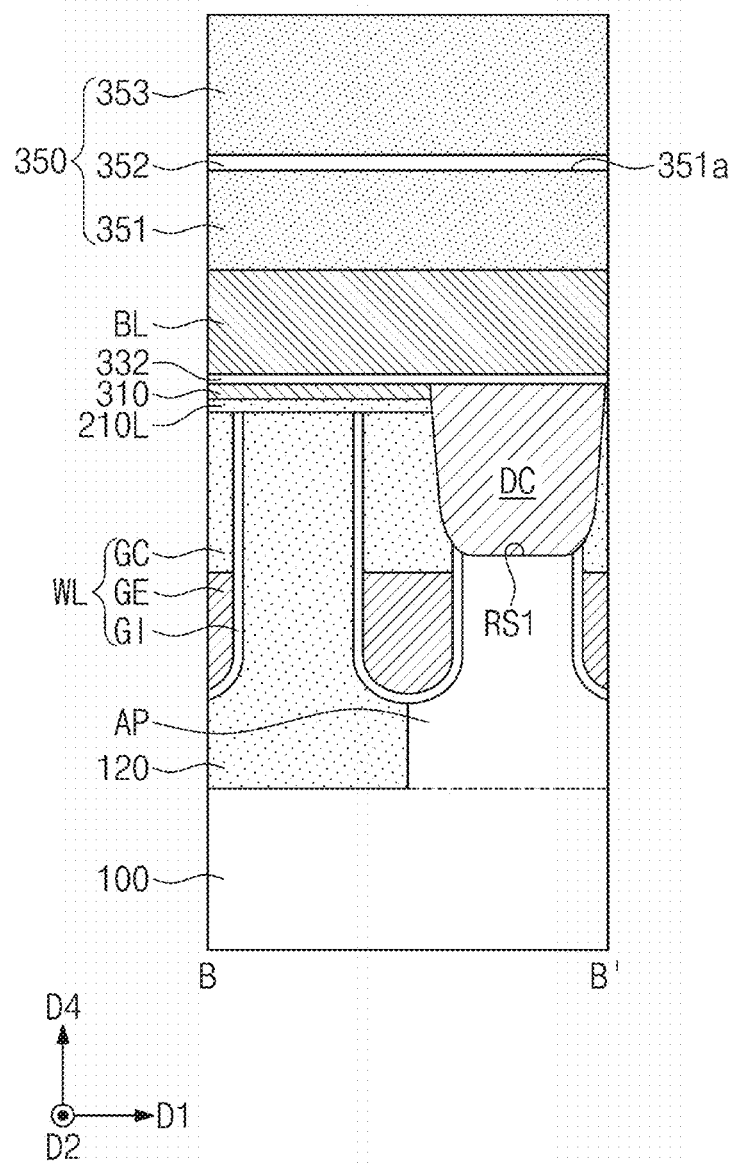

Referring to FIGS. 2, 9A and 9B, a patterning process may be performed on the bit line capping layer 350L, the bit line layer BLL, the first barrier layer 332L, the preliminary bit line contact DCp, and the polysilicon layer 310L. The patterning process may include performing an anisotropic etching process using the mask patterns MP as an etch mask. Through the patterning process, a bit line capping pattern 350, a bit line BL, a first barrier pattern 332, a bit line contact DC and a polysilicon pattern 310 may be formed, and in a plan view, may follow a shape of the mask patterns MP. For example, the buffer layer 210L may not be patterned by the patterning process. A first ohmic pattern (not shown) may be further formed between the first barrier pattern 332 and the bit line contact DC and between the first barrier pattern 332 and the polysilicon pattern 310.

The bit line BL may include a metal material. For example, the bit line BL may include at least one of tungsten, rubidium, molybdenum, titanium, or a combination thereof.

After the patterning, side surfaces BLs of the bit line BL may be exposed to the outside. Accordingly, a metal material may be oxidized on the exposed side surfaces BLs of the bit line BL.

Figure 10A:
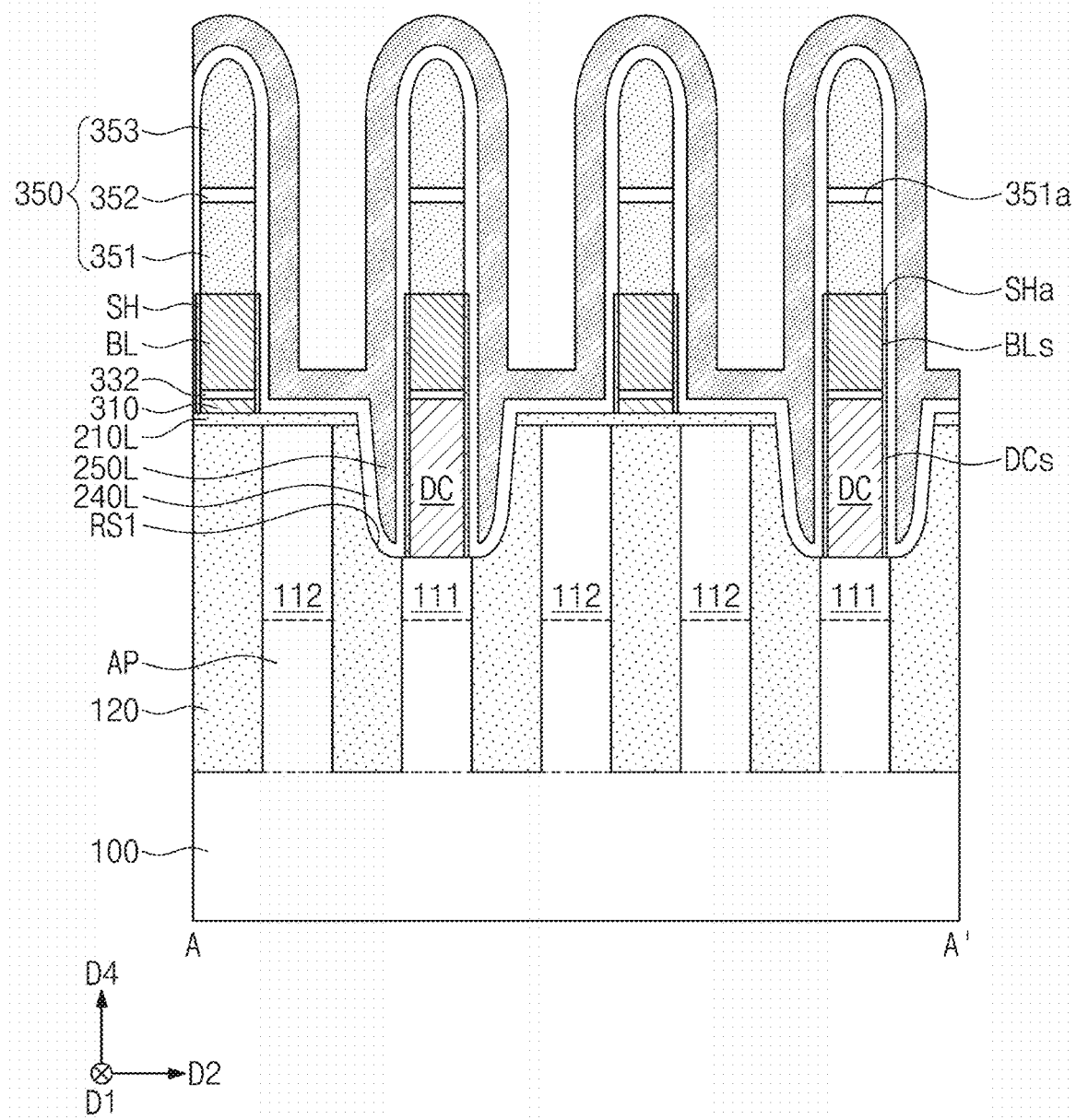
Figure 10B:
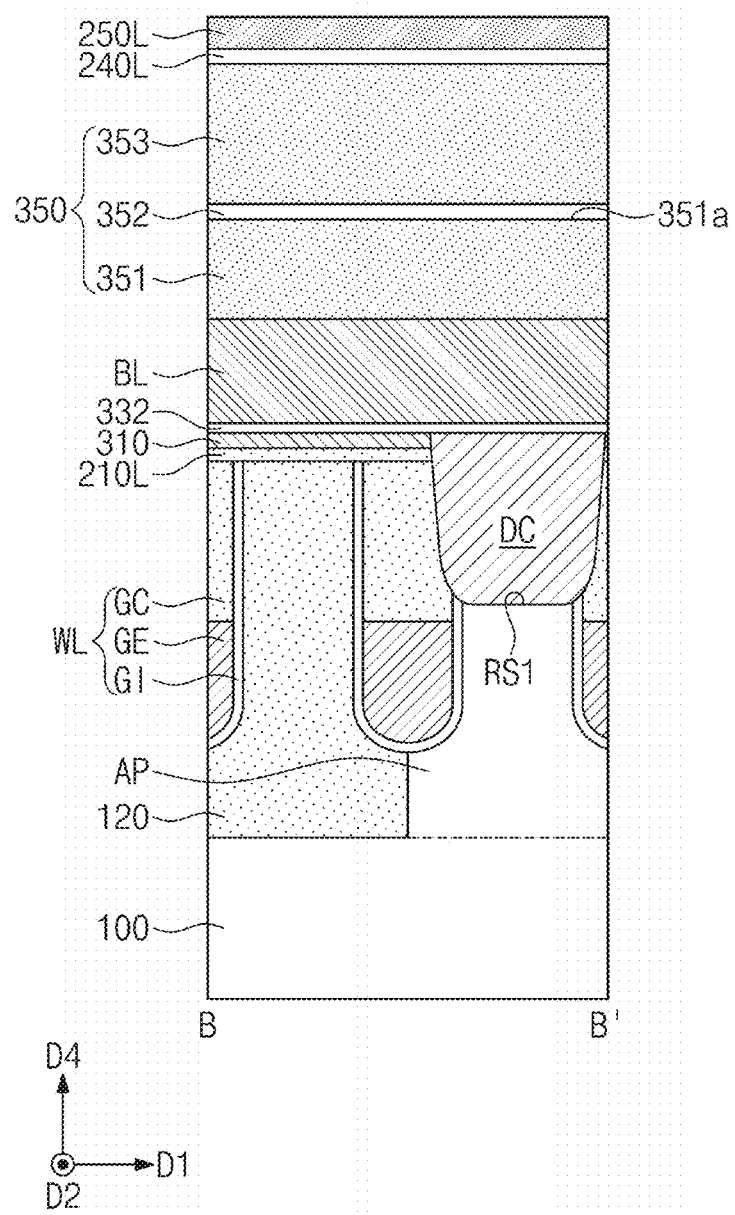

Referring to FIGS. 2, 10A, and 10B, a shield pattern SH may be formed on the side surface BLs of the bit line BL and the side surface DCs of the bit line contact DC. The shield pattern SH may cover the side surface BLs of the bit line BL and the side surface DCs of the bit line contact DC. The shield pattern SH may include at least one of polysilicon, silicon oxide, or a combination thereof.

Forming the shield pattern SH includes performing a selective polysilicon deposition process. Through the selective polysilicon deposition process, the shield pattern may be selectively deposited on the side surface BLs of the bit line BL, a side surface of the first barrier pattern 332, a side surface of the polysilicon pattern 310, and the side surface DCs of the bit line contact DC. For example, the shield pattern SH may not be formed on the bit line capping pattern 350. An upper surface SHa of the shield pattern SH may be formed at a height lower than the upper surface 351a of the first capping pattern 351.

In performing the selective polysilicon deposition process, at least one of Diisopropylamino silane (DIPAS), $SiH_4$, $Si_2H_6$, $Si_3H_8$, Dichlorosilane (DCS), Trichlorosilane (TCS), or a combination thereof may be used as a deposition source. Therefore, the shield pattern SH may further include at least one of carbon, nitrogen, chlorine, or a combination thereof.

The shield pattern SH may reduce a metal oxide of the side surface BLs of the bit line BL to a metal material. The shield pattern SH may combine with oxygen atoms in the metal oxide, and a portion of the shield pattern SH adjacent to the side surface BLs of the bit line BL may be oxidized. Accordingly, the oxidized portion of the shield pattern SH may include silicon oxide. The second portion SH1$y$ of FIGS. 5A to 5D may include the oxidized portion of the shield pattern SH. The second portion SH1$y$ may include silicon oxide. The first portion SH1$x$ of FIGS. 5A to 5D may include another non-oxidized portion of the shield pattern SH, and may be a portion of the shield pattern SH formed at a position higher than the lower end of the second portion SH1$y$. The first portion SH1$x$ may include polysilicon. The first shield pattern SH1 of FIGS. 5A to 5D may include the first and second portions SH1$x$ and SH1$y$. The second shield pattern SH2 of FIGS. 5A to 5D may be another portion of the shield pattern SH formed below the first and second portions SH1$x$ and SH1$y$.

Thereafter, a first buried layer 240L and a second buried layer 250L may be sequentially formed. The first buried layer 240L may conformally cover the bit line capping pattern 350, the shield pattern SH, an inner surface of the first recess region RS1, and the buffer layer 210L. The first buried layer 240L may include silicon oxide. The second buried layer 250L may conformally cover the bit line capping pattern 350, the shield pattern SH, and the buffer layer 210L, and fill the remainder in the first recess region RS1. The second buried layer 250L may include silicon nitride.

After the shield pattern SH is formed, an annealing process may be further performed. The annealing process may promote reduction of the bit line BL (e.g., oxidation of the shield pattern SH). However, the inventive concepts are not limited thereto.

Figure 11A:
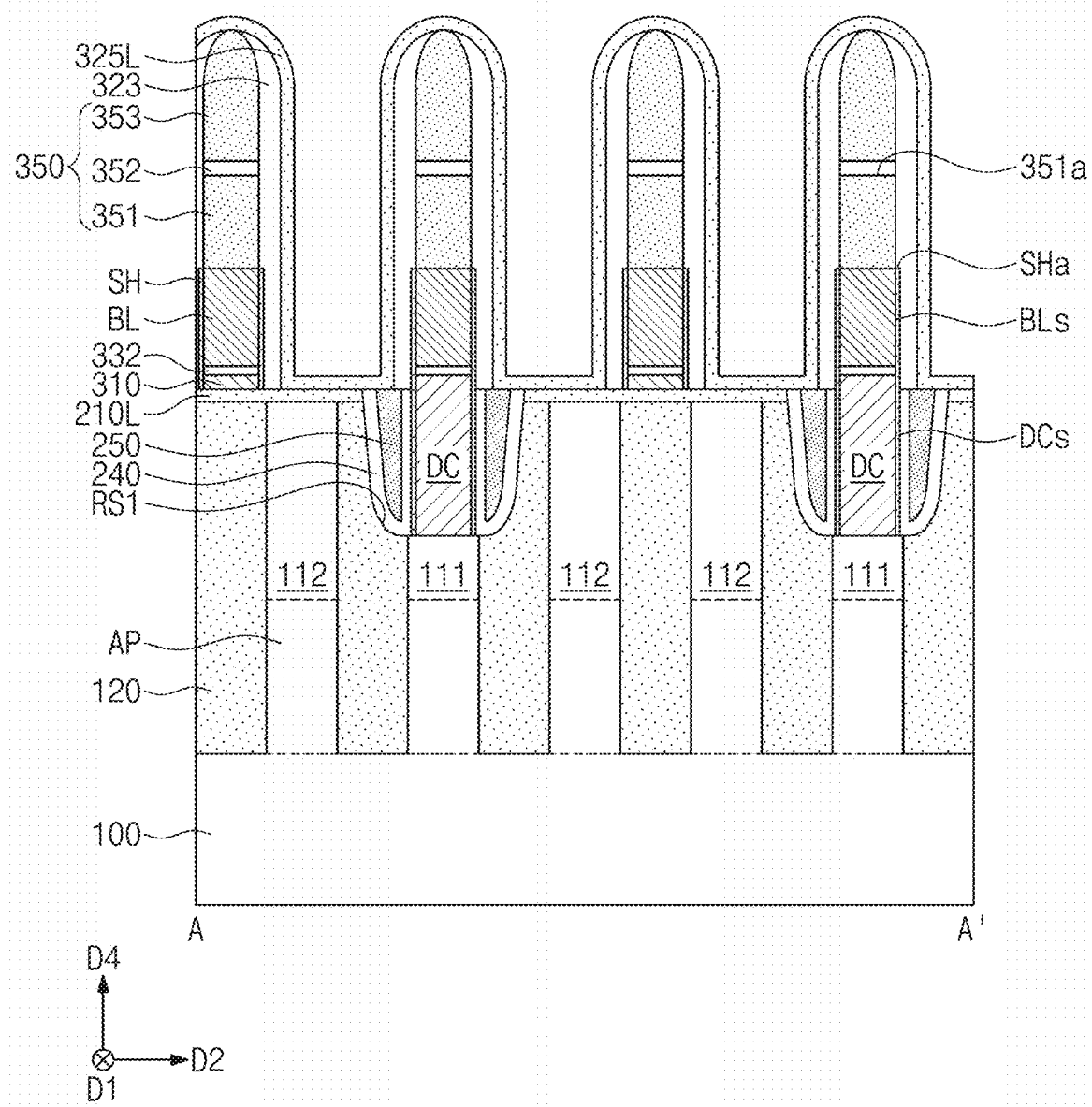
Figure 11B:
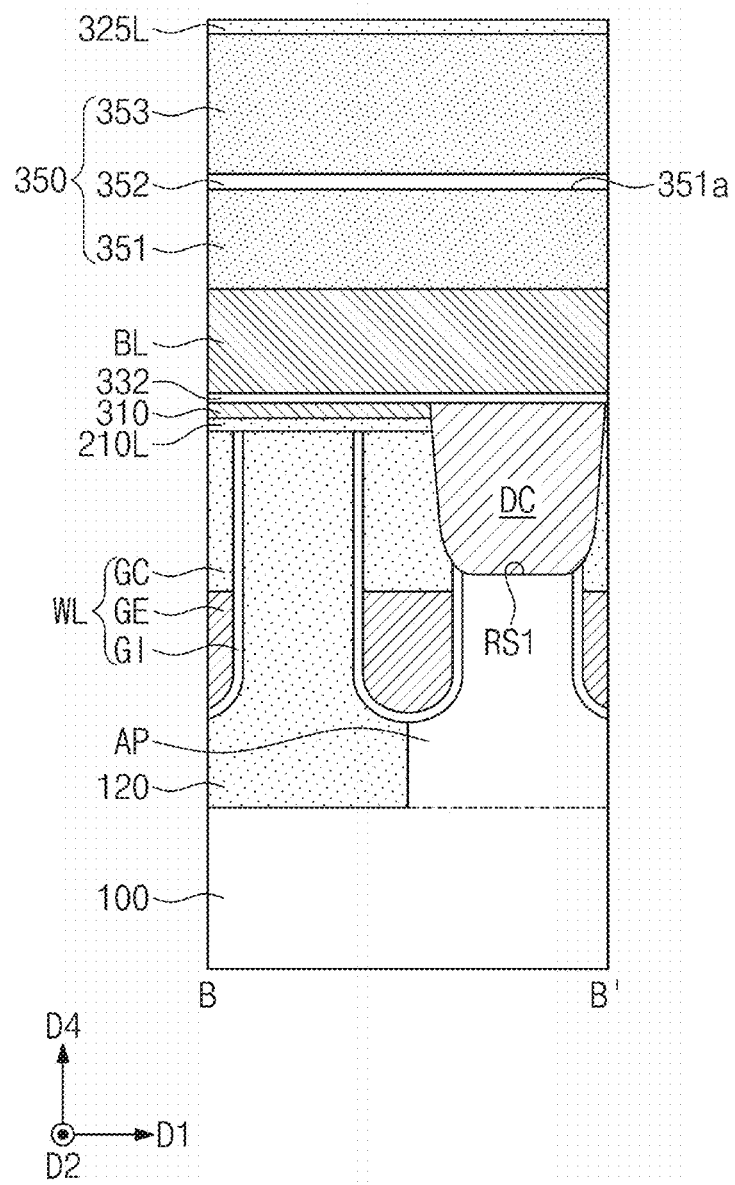

Referring to FIGS. 2, 11A, and 11B, the first and second buried layers 240L and 250L may be etched. The etching process may include an isotropic etching process. Through the etching process, upper portions of the first and second buried layers 240L and 250L may be removed to form a first buried pattern 240 and a second buried pattern 250. As the etching process proceeds, an upper portion of the shield pattern SH (e.g., an upper portion of the first shield pattern SH1 and the second shield pattern SH2) and the bit line capping pattern 350 may be exposed to the outside. The side surface BLs of the bit line BL may not be exposed to the outside by the shield pattern SH.

Thereafter, a first spacer 323 and a second spacer layer 325L covering the shield pattern SH and the bit line capping pattern 350 may be sequentially formed. For example, forming the first spacer 323 may include depositing a first spacer layer (not shown) that conformally covers the shield pattern SH and the bit line capping pattern 350, and removing a portion of the first spacer layer to separate the first spacer 323. For example, forming the second spacer layer 325L may include depositing a second spacer layer 325L that conformally covers the first spacer 323.

Referring back to FIGS. 2, 3A, and 3B, a storage node contact BC may be formed between adjacent bit lines BL. Forming the storage node contact BC may include removing a lower portion of the second spacer layer 325L between the adjacent bit lines BL, forming a second recess region RS2 on the second impurity region 112, forming a storage node contact layer (not shown) filling the second recess region RS2, and removing an upper portion of the storage node contact layer to separate the storage node contacts BC into a plurality of storage node contacts BC. Removing the upper portion of the storage node contact layer may further include an etch-back or polishing process, but is not limited thereto.

As the lower portion of the second spacer layer 325L is removed, the second spacer layer 325L may be separated into a plurality of second spacers 325. That is, a bit line spacer SPC may be formed on side surfaces of the shield pattern SH and the bit line capping pattern 350, and the bit line spacer SPC may include first and second spacers 323 and 325. While forming the second recess region RS2, a portion of the buffer layer 210L may be removed, and a buffer pattern 210 may be formed.

Although not shown, fence patterns (not shown) may be formed between the adjacent bit lines BL. The fence patterns may separate the storage node contacts BC from each other in the first direction D1. For example, the fence patterns may be formed before the storage node contacts BC are formed, and the storage node contacts BC may be disposed between the adjacent bit lines BL and between the fence patterns adjacent in the first direction D1. As another example, the fence patterns may be formed after the storage node contacts BC are formed, and the fence patterns may be formed between the adjacent bit lines BL and the storage node contacts BC adjacent in the first direction D1.

Thereafter, a second barrier pattern 410 may be formed on the bit line spacer SPC and the storage node contact BC, and may conformally cover the bit line spacer SPC and the storage node contact BC. A second ohmic pattern (not shown) may be further formed between the second barrier pattern 410 and the storage node contact BC.

A landing pad LP may be formed on the storage node contact BC. Forming the landing pad LP may include sequentially forming a landing pad layer (not shown) and mask patterns (not shown) covering upper surfaces of the storage node contact BC, and separating the landing pad layer into a plurality of landing pads LP through anisotropic etching using the mask patterns as an etch mask. Through the etching process, a portion of the second barrier pattern 410, a portion of the bit line spacer SPC, and a portion of the bit line capping pattern 350 may be further etched to be exposed to the outside. Thereafter, a filling pattern 440 may be formed to cover the exposed portions and surround each of the landing pads LP, and a data storage pattern DSP may be formed on each of the landing pads LP.

The shield pattern may mitigate or prevent the metal materials in the bit line from being oxidized, and when the metal oxide is formed, may facilitate reduction of the metal oxide to the metal material. Thus, the electrical characteristics and reliability of the semiconductor memory device may be improved.

While some example embodiments are described above, a person skilled in the art may understand that many modifications and variations are made without departing from the spirit and scope of the inventive concepts defined in the following claims. Accordingly, the disclosed example embodiments of the inventive concepts should be considered in all respects as illustrative and not restrictive, with the spirit and scope of the inventive concepts being indicated by the appended claims.

What is claimed is:

1. A semiconductor memory device comprising:
   an active pattern defined by a device isolation pattern;
   a bit line extending in a first direction on the device isolation pattern and the active pattern;
   a bit line capping pattern including a first capping pattern, a second capping pattern, and a third capping pattern sequentially stacked on an upper surface of the bit line; and
   a shield pattern covering one side of the bit line,
   wherein an upper surface of the shield pattern is at a height lower than an upper surface of the first capping pattern.

2. The semiconductor memory device of claim 1, wherein the shield pattern includes at least one of polysilicon, silicon oxide, or a combination thereof.

3. The semiconductor memory device of claim 2, wherein the shield pattern further includes at least one of carbon, nitrogen, chlorine, or a combination thereof.

4. The semiconductor memory device of claim 1, wherein the bit line includes at least one of tungsten, rubidium, molybdenum, titanium, or a combination thereof.

5. The semiconductor memory device of claim 1, wherein the shield pattern is in contact with the one side of the bit line.

6. The semiconductor memory device of claim 1, further comprising:
   a bit line contact between the active pattern and the bit line,
   wherein the shield pattern extends on one side of the bit line contact.

7. The semiconductor memory device of claim 6, wherein the shield pattern includes a first shield pattern on the one side of the bit line and a second shield pattern on the one side of the bit line contact, and
   the second shield pattern includes polysilicon.

8. The semiconductor memory device of claim 7, wherein the first shield pattern may include at least one of polysilicon, silicon oxide, or a combination thereof.

9. The semiconductor memory device of claim 8, wherein the first shield pattern includes a first portion on the one side of the bit line and a second portion between the one side of the bit line and the first portion,
   the first portion includes polysilicon, and
   the second portion includes silicon oxide.

10. The semiconductor memory device of claim 1, further comprising:
    a bit line spacer on the one side of the bit line,
    wherein the bit line spacer is spaced apart from the one side of the bit line by the shield pattern.

11. A semiconductor memory device comprising:
    an active pattern defined by a device isolation pattern;
    a bit line extending in a first direction on the device isolation pattern and the active pattern;
    a bit line contact between the active pattern and the bit line; and
    a shield pattern covering one side of the bit line and extending on one side of the bit line contact, wherein the shield pattern includes at least one of polysilicon, silicon oxide, or a combination thereof.

12. The semiconductor memory device of claim 11, wherein the shield pattern further includes at least one of carbon, nitrogen, chlorine, or a combination thereof.

13. The semiconductor memory device of claim 11, wherein
the shield pattern includes a first shield pattern on the one side of the bit line and a second shield pattern on the one side of the bit line contact, and
the second shield pattern includes polysilicon.

14. The semiconductor memory device of claim 13, wherein the first shield pattern includes at least one of polysilicon, silicon oxide, or a combination thereof.

15. The semiconductor memory device of claim 14, wherein
the first shield pattern includes a first portion on the one side of the bit line and a second portion between the one side of the bit line and the first portion, the first portion includes polysilicon, and
the second portion includes silicon oxide.

16. The semiconductor memory device of claim 11, further comprising:
a bit line spacer on the one side of the bit line,
wherein the bit line spacer is spaced apart from the one side of the bit line by the shield pattern.

17. The semiconductor memory device of claim 16, further comprising:
a bit line capping pattern on an upper surface of the bit line,
wherein the bit line spacer is in contact with one side of the bit line capping pattern.

18. The semiconductor memory device of claim 11, wherein the shield pattern is in contact with the one side of the bit line.

19. A semiconductor memory device comprising:
active patterns defined by a device isolation pattern;
bit lines extending in a first direction on the device isolation pattern and the active patterns, the bit lines spaced apart from each other in a second direction crossing the first direction;
word lines extending in the second direction within the active patterns and spaced apart from each other in the first direction;
bit line contacts interposed between the active patterns and the bit lines, the bit line contacts spaced apart from each other in the first and second directions;
bit line capping patterns on upper surfaces of the bit lines, each of the bit line capping patterns including a first capping pattern, a second capping pattern, and a third capping pattern that are sequentially stacked;
bit line spacers disposed on side surfaces of the bit lines, respectively;
shield patterns interposed between the side surfaces of the bit lines and the bit line spacers, respectively;
storage node contacts interposed between adjacent bit lines and spaced apart from each other in the first and second directions;
landing pads on the storage node contacts; and
data storage patterns connected to the active patterns through the storage node contacts and the landing pads,
wherein an upper surface of the first capping pattern is at a height higher than an upper surface of a corresponding one of the shield patterns.

20. The semiconductor memory device of claim 19, wherein the shield patterns include at least one of polysilicon, silicon oxide, or a combination thereof.

* * * * *